US012812949B2

(12) United States Patent
Siemieniec et al.

(10) Patent No.: US 12,812,949 B2
(45) **Date of Patent: *Nov. 24, 2026**

(54) SEMICONDUCTOR DEVICE HAVING NEEDLE-SHAPED FIRST FIELD PLATE STRUCTURES AND NEEDLE-SHAPED SECOND FIELD PLATE STRUCTURES

(71) Applicant: Infineon Technologies Austria AG, Villach (AT)

(72) Inventors: Ralf Siemieniec, Villach (AT); Oliver Blank, Villach (AT); Franz Hirler, Isen (DE); Michael Hutzler, Villach (AT); David Laforet, Villach (AT); Cédric Ouvrard, Villach (AT); Li Juin Yip, Villach (AT)

(73) Assignee: Infineon Technologies Austria AG, Villach (AT)

( * ) Notice: Subject to any disclaimer, the term of this patent is extended or adjusted under 35 U.S.C. 154(b) by 1147 days.

This patent is subject to a terminal disclaimer.

(21) Appl. No.: 17/881,842

(22) Filed: Aug. 5, 2022

(65) Prior Publication Data

US 2022/0376062 A1 Nov. 24, 2022

Related U.S. Application Data

(60) Continuation of application No. 17/098,576, filed on Nov. 16, 2020, now Pat. No. 11,462,620, which is a continuation of application No. 16/691,828, filed on Nov. 22, 2019, now Pat. No. 10,872,957, which is a (Continued)

(30) Foreign Application Priority Data

Feb. 25, 2016 (DE) ............................ 102016103384

(51) Int. Cl.
*H10D 30/00* (2025.01)
*H10D 12/00* (2025.01)
(Continued)

(52) U.S. Cl.
CPC ......... *H10D 64/112* (2025.01); *H10D 12/481* (2025.01); *H10D 30/665* (2025.01);
(Continued)

(58) Field of Classification Search
CPC .. H10D 30/665; H10D 30/668; H10D 64/112; H10D 64/115; H10D 64/117
See application file for complete search history.

(56) References Cited

U.S. PATENT DOCUMENTS 7,052,963 B2 5/2006 Williams et al.
7,989,887 B2 8/2011 Hsieh
(Continued)

FOREIGN PATENT DOCUMENTS

DE 102006036347 B4 1/2012
DE 102005052734 B4 2/2012
(Continued)

*Primary Examiner* — Reema Patel
(74) *Attorney, Agent, or Firm* — Murphy, Bilak & Homiller, PLLC

(57) ABSTRACT

A semiconductor device includes a transistor cell region, and a first termination region devoid of transistor cells. The transistor cell region includes a gate structure, a plurality of needle-shaped first field plate structures, body regions of a second conductivity type, and source regions of a first conductivity type. The first termination region surrounds the transistor cell region and includes needle-shaped second field plate structures. The needle-shaped first field plate structures are arranged in a first pattern and the needle-shaped second field plate structures are arranged in a second pattern.

21 Claims, 13 Drawing Sheets

Related U.S. Application Data division of application No. 15/437,191, filed on Feb. 20, 2017, now Pat. No. 10,510,846.

(51) Int. Cl.

| | |
|---|---|
| ***H10D 30/66*** | (2025.01) |
| ***H10D 62/10*** | (2025.01) |
| ***H10D 64/00*** | (2025.01) |
| ***H10D 64/27*** | (2025.01) |
| *H10D 62/13* | (2025.01) |

(52) U.S. Cl.

CPC ......... *H10D 30/668* (2025.01); *H10D 62/105* (2025.01); *H10D 62/112* (2025.01); *H10D 62/115* (2025.01); *H10D 62/127* (2025.01); *H10D 64/117* (2025.01); *H10D 64/513* (2025.01); *H10D 64/519* (2025.01); *H10D 12/461* (2025.01); *H10D 62/106* (2025.01); *H10D 62/157* (2025.01)

(56) References Cited

U.S. PATENT DOCUMENTS

| | | | | |
|---|---|---|---|---|
| 8,080,858 | B2 | 12/2011 | Hirler et al. | |
| 8,247,865 | B2 | 8/2012 | Hirler | |
| 8,963,212 | B2 | 2/2015 | Yedinak et al. | |
| 9,224,855 | B2 | 12/2015 | Zeng et al. | |
| 9,373,700 | B2 | 6/2016 | Hirler et al. | |
| 9,455,205 | B2 | 9/2016 | Zundel et al. | |
| 9,620,636 | B2 | 4/2017 | Siemieniec et al. | |
| 9,735,264 | B2 | 8/2017 | Krischke et al. | |
| 9,842,917 | B2 | 12/2017 | Darwish et al. | |
| 9,899,343 | B2 | 2/2018 | West et al. | |
| 10,510,846 | B2 | 12/2019 | Siemieniec et al. | |
| 10,872,957 | B2 | 12/2020 | Siemieniec et al. | |
| 11,462,620 | B2 * | 10/2022 | Siemieniec .......... | H10D 12/481 |
| 2009/0146249 | A1 * | 6/2009 | Gogoi ............... | H10W 10/0145 257/E23.001 |
| 2016/0013267 | A1 * | 1/2016 | Lee ...................... | H10D 62/107 438/420 |
| 2016/0064477 | A1 | 3/2016 | Blank et al. | |
| 2016/0064548 | A1 | 3/2016 | Laforet et al. | |

FOREIGN PATENT DOCUMENTS

| | | | |
|---|---|---|---|
| DE | 102014112338 | A1 | 3/2016 |
| DE | 102014112371 | A1 | 3/2016 |
| DE | 102014112379 | A1 | 3/2016 |

* cited by examiner

SEMICONDUCTOR DEVICE HAVING NEEDLE-SHAPED FIRST FIELD PLATE STRUCTURES AND NEEDLE-SHAPED SECOND FIELD PLATE STRUCTURES

BACKGROUND

In power semiconductor devices, for example IGFETs (insulated gate field effect transistors) a load current typically flows in a vertical direction between two load electrodes formed at opposite sides of a semiconductor die. In a blocking mode field plate structures extending from one side into the semiconductor die deplete a drift portion of the semiconductor die and facilitate higher dopant concentrations in the drift portion without adverse impact on the blocking capability. Shrinking the field plate structures to needle-shaped field plate structures facilitates a grid-like gate structure between the field plate structures, wherein the grid-like gate structure provides a larger total channel width per unit area than comparable stripe-shaped gate structures.

It is desirable to improve reliable semiconductor devices with needle-shaped field electrodes and low parasitic capacitances.

SUMMARY

According to an embodiment, a transistor cell region of semiconductor device includes needle-shaped first field plate structures that extend from a first surface into a semiconductor portion that includes a drift structure of a first conductivity type. An inner termination region, which surrounds the transistor cell region, includes needle-shaped second field plate structures. The inner termination region is devoid of counter-doped regions that are spaced from a second surface opposite to the first surface. An outer termination region is sandwiched between an outer lateral surface of the semiconductor portion and outermost needle-shaped second field plate structures.

According to another embodiment, an electronic assembly includes a semiconductor device, wherein a transistor cell region of the semiconductor device includes needle-shaped first field plate structures that extend from a first surface into a semiconductor portion. The semiconductor portion includes a drift structure of a first conductivity type. An inner termination region, which surrounds the transistor cell region, includes needle-shaped second field plate structures. The inner termination region is devoid of counter-doped regions that are spaced from a second surface opposite to the first surface. An outer termination region is sandwiched between an outer lateral surface of the semiconductor portion and outermost needle-shaped second field plate structures.

According to yet another embodiment, a semiconductor device comprises a semiconductor substrate, a transistor cell region formed in the semiconductor substrate and an inner termination region formed in the semiconductor substrate and devoid of transistor cells. The transistor cell region comprises a plurality of transistor cells and a gate structure that forms a grid separating transistor sections of the transistor cells from each other, each of the transistor sections including a needle-shaped first field plate structure extending from a first surface into the semiconductor substrate. The inner termination region surrounds the transistor cell region and comprises needle-shaped second field plate structures extending from the first surface into the semiconductor substrate. The first field plate structures form a first portion of a regular pattern and the second field plate structures form a second portion of the same regular pattern.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms “having”, “containing”, “including”, “comprising” and the like are open, and the terms indicate the presence of stated structures, elements or features but do not preclude additional elements or features. The articles “a”, “an” and “the” are intended to include the plural as well as the singular, unless the context clearly indicates otherwise.

The term “electrically connected” describes a permanent low-ohmic connection between electrically connected elements, for example a direct contact between the concerned elements or a low-ohmic connection via a metal and/or highly doped semiconductor. The term “electrically coupled” includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating “−” or “+” next to the doping type “n” or “p”. For example, “$n^-$” means a doping concentration which is lower than the doping concentration of an “n”-doping region while an “n+”-doping region has a higher doping concentration than an “n”-doping region. Doping regions of the same relative doping concentration do not necessarily have the same absolute doping concentration. For example, two different “n”-doping regions may have the same or different absolute doping concentrations.

Figures 1A, 1B:
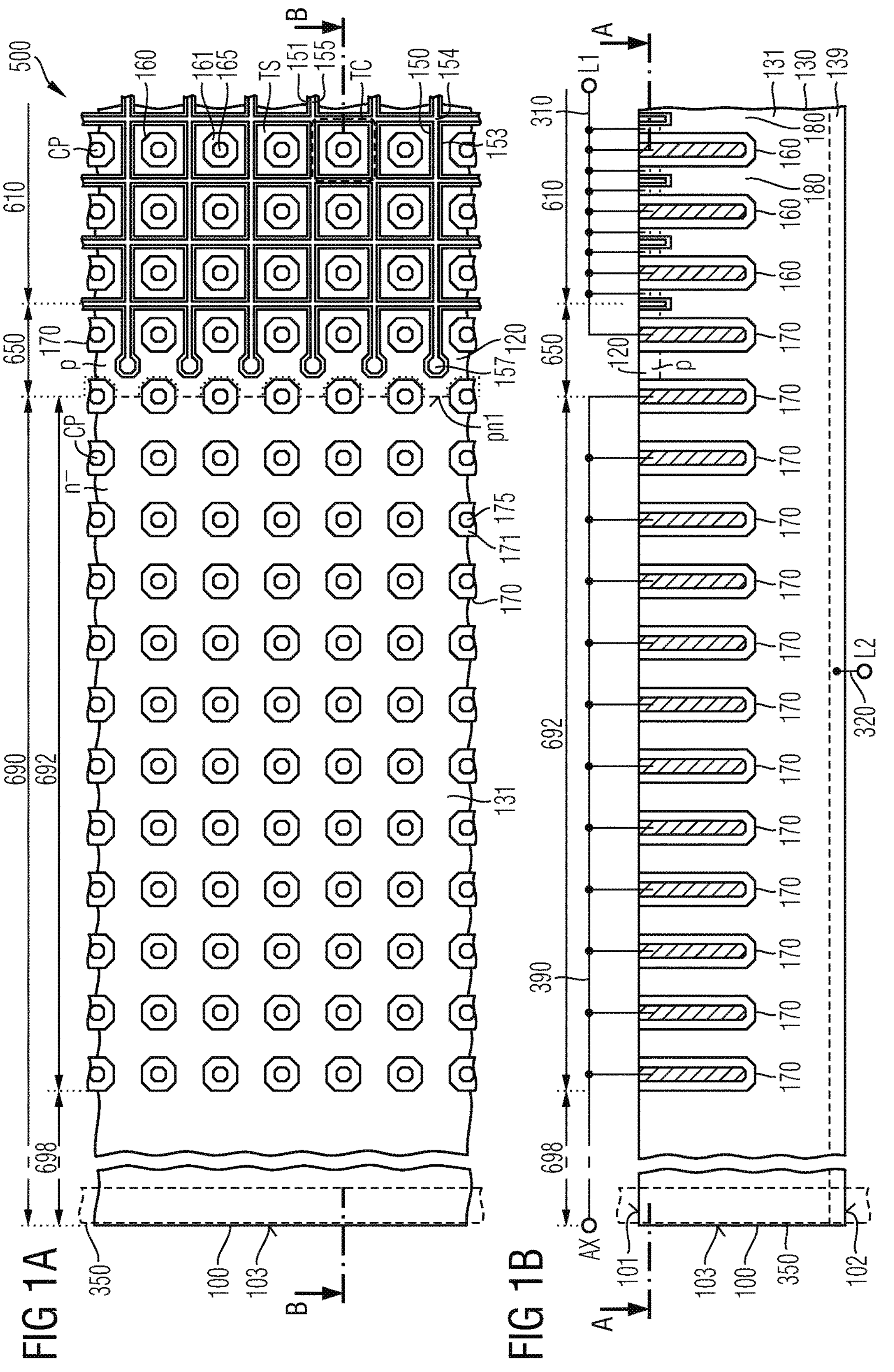
FIG. 1A is a schematic horizontal cross-sectional view of a portion of a semiconductor device including needle-shaped first field plate structures in a transistor cell region with source regions and needle-shaped second field plate structures in a termination region without source regions according to an embodiment.
FIG. 1B is a schematic vertical cross-sectional view of the semiconductor device portion of FIG. 1A along line B-B.
Figure 1C:
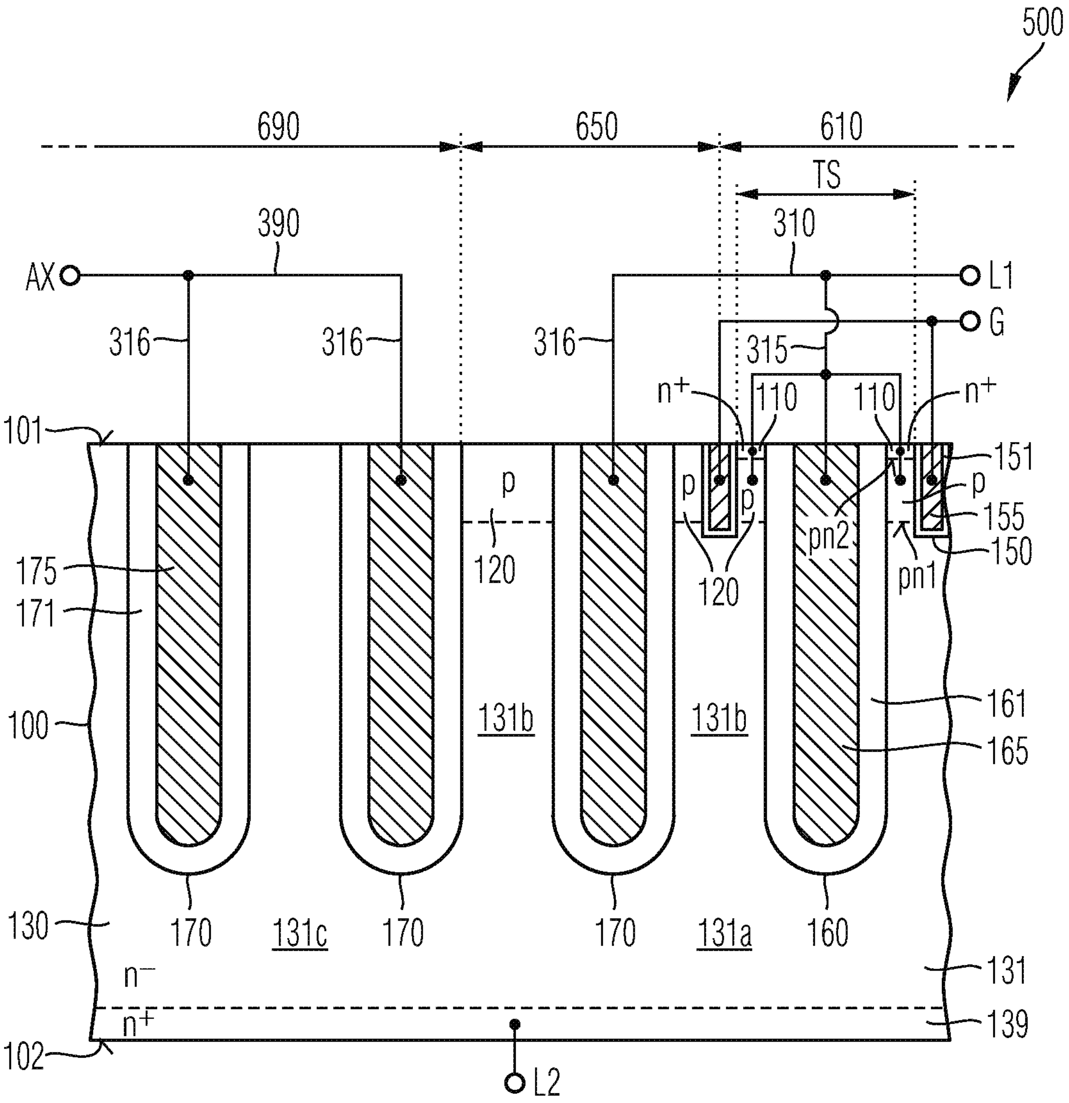
FIG. 1C is an enlarged view of a detail of FIG. 1B.

FIGS. 1A to 1C refer to a semiconductor device 500 including a plurality of identical transistor cells TC. The semiconductor device 500 may be or may include an IGFET, for example an MOSFET (metal oxide semiconductor FET) in the usual meaning including FETs with metal gates as well as FETs with semiconductor gates, e.g., from polycrystalline silicon. According to another embodiment, the semiconductor device 500 may be an IGBT (insulated gate bipolar transistor) or an MCD (MOS controlled diode).

The semiconductor device 500 is based on a semiconductor portion 100 from a single crystalline semiconductor material such as silicon (Si), silicon carbide (SiC), germanium (Ge), a silicon germanium crystal (Site), gallium nitride (GaN), gallium arsenide (GaAs) or any other $A_{III}B_V$ semiconductor.

The semiconductor portion 100 has a first surface 101 which may be approximately planar or which may be defined by a plane spanned by coplanar surface sections as well as a planar second surface 102 parallel to the first surface 101. A distance between the first and second surfaces 101, 102 depends on a voltage blocking capability the semiconductor device 500 is specified for and may be at least 20 μm. According to other embodiments, the distance may be in the range of several hundred μm. A lateral outer surface 103, which is tilted to the first and second surfaces 101, 102, connects the first and second surfaces 101, 102.

In a plane perpendicular to the cross-sectional plane the semiconductor portion 100 may have a rectangular shape with an edge length of several millimeters. A normal to the first surface 101 defines a vertical direction and directions orthogonal to the vertical direction are horizontal directions.

The semiconductor portion 100 includes a drain structure 130 that includes a drift structure 131 of a first conductivity type and a contact portion 139 between the drift structure 131 and the second surface 102. At least in portions of the vertical extension of the drift structure 131 a dopant concentration may gradually or in steps increase or decrease with increasing distance to the first surface 101. According to other embodiments, the dopant concentration in the drift structure 131 may be approximately uniform. A mean dopant concentration in the drift structure 131 may be between 1E13 $cm^{-3}$ and 1E18 $cm^{-3}$, for example, in a range from 5E15 $cm^{-3}$ to 1E17 $cm^{-3}$. For a silicon-based semiconductor portion 100 the mean dopant concentration in the drift structure 131 may be between 1E15 $cm^{-3}$ and 1E17 $cm^{-3}$, for example, in a range from 5E15 $cm^{-3}$ to 5E16 $cm^{-3}$.

The contact portion 139 may be a heavily doped base substrate or a heavily doped layer. Along the second surface 102 a dopant concentration in the contact portion 139 is sufficiently high to form an ohmic contact with a metal directly adjoining the second surface 102. In case the semiconductor portion 100 is based on silicon, in an n-conductive contact portion 139 the dopant concentration along the second surface 102 may be at least 1E18 $cm^{-3}$, for example at least 5E19 $cm^{-3}$. In a p-conductive contact portion 139, the dopant concentration may be at least 1E16 $cm^{-3}$, for example at least 5E17 $cm^{-3}$. For IGFETs and semiconductor diodes, the contact portion 139 has the same conductivity as the drift structure 131. For IGBTs the contact portion 139 may have the complementary second conductivity type.

The drain structure 130 may include further doped regions, e.g., a field stop layer or a buffer zone between the drift structure 131 and the contact portion 139 or barrier zones.

A transistor cell region 610 includes the transistor cells TC, wherein a gate structure 150 that forms a regular grid separates transistor sections TS of the transistor cells TC from each other. The gate structure 150 may form a complete grid which meshes completely surround the transistor sections TS or may include gaps where connection sections of the semiconductor portion 100 form bridges between neighboring transistor sections TS. According to the illustrated embodiment, the gate structure 150 forms a regular and complete grid and the transistor sections TS are formed in the meshes of the gate structure 150.

The gate structure 150 extends from the first surface 101 into the semiconductor portion 100 and may include stripe-shaped gate edge portions 153 as well as gate node portions 154. Within the transistor cell region 610 each gate edge portion 153 extends along one common edge of two neighboring transistor sections TS. The gate edge portions 153 have uniform width and are straight without bends. The gate edge portions 153 may be formed along all edges of transistor sections TS of all functional transistor cells TC within the transistor cell region 610.

The gate node portions 154 connect two, three or more of the gate edge portions 153 with each other and are formed at some or all of the nodes of the gate structure 150, wherein the gate structure 150 may include two or more different types of node portions 154.

The gate node portions 154 may be formed such that a minimum inner angle of the transistor sections TS is at least 120°, for example at least 135°.

A horizontal cross-sectional area of the gate node portions 154 may include stripe-shaped partial areas with a width of the gate edge portions 153 and one, two, three or four isosceles triangular partial areas fitting between two of the stripe-shaped partial areas, respectively.

The gate node portions 154 are arranged such that each of the gate edge portions 153 is connected to the other gate edge portions 153 through connections within the transistor cell region 610, through connections outside of the transistor cell region 610, or through both connections within the transistor cell region 610 and connections outside of the transistor cell region 610.

The gate structure 150 includes a conductive gate electrode 155 that includes or consists of a heavily doped polycrystalline silicon layer and/or a metal-containing layer. The gate electrode 155 is completely insulated against the semiconductor portion 100, wherein a gate dielectric 151 separates the gate electrode 155 at least from body regions 120. The gate dielectric 151 capacitively couples the gate electrode 155 to channel portions of the body regions 120. The gate dielectric 151 may include or consist of a semiconductor oxide, for example thermally grown or deposited silicon oxide, semiconductor nitride, for example deposited or thermally grown silicon nitride, a semiconductor oxynitride, for example silicon oxynitride, or a combination thereof. The gate electrode 155 is electrically connected or coupled to a gate terminal G of the semiconductor device 500.

A vertical extension of the gate structures 150 may be in a range from 100 nm to 5000 nm, for example in a range from 300 nm to 1000 nm. A horizontal width of the gate edge portions 153 may be in a range from 100 nm to 1000 nm, for example, from 250 nm to 750 nm.

The transistor sections TS of the transistor cells TC are in the meshes of the gate structure 150 and include semiconducting portions of the transistor cells TC as well as first field plate structures 160 that extend from the first surface 101 into the semiconductor portion 100. Portions of the first field plate structures 160 between the first surface 101 and buried end portions may have approximately vertical sidewalls or may slightly taper at an angle of, e.g., 89 degree with respect to the first surface 101. The sidewalls may be straight or slightly bulgy.

The first field plate structures 160 may be equally spaced along parallel lines, wherein a plurality of first field plate structures 160 with the same horizontal cross-section area may be arranged along each line, and wherein the lines may be equally spaced.

Each first field plate structure 160 includes a conductive first field electrode 165 and a first field dielectric 161 surrounding the first field electrode 165, respectively. The first field electrode 165 includes or consists of a heavily doped silicon layer and/or a metal-containing layer. The first field dielectric 161 separates the first field electrode 165 from the surrounding semiconductor material of the semiconductor portion 100 and may include or consist of a thermally grown silicon oxide layer, a deposited silicon oxide layer, e.g. a silicon oxide based on TEOS (tetraethylorthosilicate), or both.

A vertical extension of the first field plate structure 160 is smaller than a distance between the first surface 101 and the contact portion 139 such that the drift structure 131 may include a continuous drift section **131*a* between the first field plate structures 160 and the contact portion 139 as well as columnar drift sections 131*b* between neighboring first field plate structures 160. A vertical extension of the first field plate structures 160 is greater than a vertical extension of the gate structure 150. The vertical extension of the first field plate structures 160 may be in a range from 1 μm to 50 μm, for example in a range from 2 μm to 20 μm. First horizontal extensions of the first field plate structures 160** may be in a range from 0.1 μm to 20 μm, for example in a range from 0.2 μm to 5 μm, respectively.

The cross-sectional areas of the first field electrodes 165 and the first field plate structures 160 may be rectangles, regular or distorted polygons with or without rounded and/or beveled corners, ellipses or ovals. According to an embodiment, two orthogonal horizontal extensions are approximately equal and the cross-sectional areas of the first field electrodes 165 and the first field plate structures 160 are circles or regular polygons with or without rounded or beveled corners, such as octagons, hexagons or squares.

The first field plate structures 160 allow high dopant concentrations in the drift structure 131 without loss of blocking capability of the semiconductor device 500. The needle-shaped first field electrodes 165 increase the available cross-sectional area for the drift structure 131 and reduce the on-state resistance RDSon compared to stripe-shaped field electrodes.

The transistor sections TS with the semiconducting portions of the transistor cells TC are formed in mesa sections of the semiconductor portion 100, protruding from a continuous section of the semiconductor portion 100 between the first field plate structures 160 and the second surface 102. A horizontal mean width of the mesa sections may be in a range from 0.2 μm to 10 μm, for example in a range from 0.3 μm to 1 μm.

Each transistor section TS includes a body region 120 of the second conductivity type. The body regions 120 form first pn junctions pn1 with the drain structure 130, e.g., the columnar drift sections **131*b*, and second pn junctions pn2 with source regions 110 formed between the body regions 120 and the first surface 101. The body regions 120 completely surround the first field plate structures 160 in a horizontal plane. Each body region 120** may include a heavily doped portion for forming an ohmic contact with a metal contact structure.

The source regions 110 may be wells extending from the first surface 101 into the semiconductor portion 100, for example into the body regions 120. One source region 110 may surround the first field plate structure 160 or two or more separated source regions 110 may be formed around the first field plate structure 160 in a horizontal plane. The source regions 110 may directly adjoin the first field plate structures 160 or may be spaced from the first field plate structures 160.

The source regions 110 as well as the body regions 120 are electrically connected to a first load electrode 310. The first load electrode 310 may be electrically coupled or connected to a first load terminal L1, for example the source terminal in case the semiconductor device 500 is an IGFET, an emitter terminal in case the semiconductor device 500 is an IGBT or an anode terminal in case the semiconductor device 500 is a semiconductor diode.

A second load electrode 320, which directly adjoins the second surface 102 and the contact portion 139, may form or may be electrically connected to a second load terminal L2, which may be the drain terminal in case the semiconductor device 500 is an IGFET, a collector terminal in case the semiconductor device 500 is an IGBT or a cathode terminal in case the semiconductor device 500 is a semiconductor diode.

The first field electrodes 165 may be electrically connected to the first load electrode 310, to another terminal of the semiconductor device 500, to an output of an internal or external driver circuit, or may float. The first field electrodes 165 may also be divided in different subelectrodes which may be insulated from each other and which may be coupled to identical or different potentials.

In the illustrated embodiments and for the following description, the body regions 120 are p-type, whereas the source regions 110 and the drift structure 131 are n-type. Similar considerations as outlined below apply also to embodiments with n-type body regions 120, p-type source regions 110, and a p-type drift structure 131.

When a voltage applied to the gate electrode 155 exceeds a preset threshold voltage, electrons accumulate and form inversion channels in the channel portions of the body regions 120 directly adjoining the gate dielectric 151 in the body regions 120. The second pn junctions pn2 with the inversion channels get transparent for electrons in a forward biased state of the semiconductor device 500 with a positive voltage applied between the drain structure 130 and the source regions 110 and a load current flows between the first and second load terminals L1, L2 in vertical direction through the semiconductor device 500.

A termination region 690 without functional transistor cells TC surrounds the transistor cell region 610 and may directly adjoin a lateral outer surface 103 of the semiconductor portion 100. The termination region 690 is devoid of contact structures electrically connecting portions of the drift structure 131 directly or through pn junctions or through unipolar homojunctions with the first load electrode 310.

The termination region 690 includes an inner termination region 692 that surrounds the transistor cell region 610 and that includes needle-shaped second field plate structures 170 extending into the drift structure 131 in the termination region 690. The inner termination region 692 is devoid of counter-doped regions that contain dopants of the conductivity type of the body regions 120 and that are spaced from the second surface 102. The term “counter-doped region” includes regions of the conductivity type of the body regions 120, which form pn junctions with the drift structure 131, as well as regions of the conductivity type of the drift structure 131, in which a net dopant concentration is lower than in adjoining portions of the drift structure 131 and which form unipolar homojunctions with the drift structure 131.

No pn junctions or unipolar homojunctions are formed between the second field plate structures 170 or directly adjoining to the second field plate structures 170. Between and around the second field plate structures 170 the drift structure 131 does not contain dopants of a complementary conductivity type. The dopant concentration is uniform or gradually decreases or increases along only one direction or only along two orthogonal directions.

The inner termination region 692 may be completely devoid of doped zones equivalent to the source regions 110 in position and dopant concentration and/or may devoid of contact structures electrically connecting doped zones equivalent to source regions 110 with the first load electrode 310 or with a node with a potential closer to that of the first load electrode 310 than to the second load electrode 320.

The second field plate structures 170 may consist of at least one of insulating and intrinsic semiconducting materials. According to the illustrated embodiment, at least some of or all second field plate structures 170 include a second field electrode 175 and a second field dielectric 171 surrounding the second field electrode 175, respectively.

The second field electrode 175 may float or may be electrically connected to an auxiliary electrode 390 which may be connected to an auxiliary terminal AX of the semiconductor device 500, to an internal circuit node or to an output of an internal driver circuit. According to another embodiment, the auxiliary electrode 390 and the first load electrode 310 form a common electrode such that both the first and the second field electrodes 165, 175 are connected to the first load electrode 310 and the first load terminal L1.

The second field electrode 175 includes or consists of a doped polycrystalline silicon layer and/or a metal-containing layer. The second field dielectric 171 separates the second field electrode 175 from the surrounding semiconductor material of the semiconductor portion 100 and may include or consist of a thermally grown silicon oxide layer. According to an embodiment, the second field dielectric 171 may include or consist of a deposited silicon oxide layer, e.g. a silicon oxide based on TEOS.

The first and second field dielectrics 161, 171 may have the same thickness and the same configuration, e.g., the same layer structure. For example, if both the first and the second field dielectrics 161, 171 consist of thermally grown semiconductor oxide, e.g. silicon oxide, the thickness of the first field dielectrics 161 may be equal to the thickness of the second field dielectric 171. If the first and second field dielectrics 161, 171 include a deposited oxide layer, the thickness of the deposited oxide layer may be the same in the first and second field dielectrics 161, 171.

The vertical extension of the second field plate structures 170 is equal to or may be greater than the vertical extension of the first field plate structures 160. A horizontal cross-sectional area of the second field plate structures 170 may be equal to or greater than a horizontal cross-sectional area of the first field plate structures 160. According to an embodiment the first and second field plate structures 160, 170 may have the same horizontal cross-sectional shape and cross-sectional area and may be formed contemporaneously in the same photolithography process.

Center points CP of the second field plate structures 170 and the first field plate structures 160 may be equally spaced such that the second field plate structures 170 and the first field plate structures 160 complement each other in a regular pattern, wherein center-to-center distances between neighboring second field plate structures 170, between neighboring first and second field plate structures 160, 170 and between neighboring first field plate structures 160 are equal. The arrangement of the center points of the second field plate structures 170 may be congruent to the arrangement of the center points of a portion of the first field plate structures 160. In other words, the first field plate structures 160 form a first portion of a regular pattern and the second field plate structures 170 may form a second portion of the same regular pattern.

The number of rows of second field plate structures 170 in the termination region 690 between the transistor cell region 610 and the lateral outer surface 103 may be between 2 and 21, for example between 5 and 15. The termination region 690 further includes an outer termination region 698 sandwiched between the lateral outer surface 103 and the outermost second field plate structures 170 of the inner termination region 692. The outer termination region 698 may include an edge construction 350 that includes a conductive structure electrically separated from the first load electrode 310. The conductive structure may be electrically coupled to the second load electrode 320 such that during operation of the semiconductor device 500 an electric potential of the conductive structure is equal to or at least close to that of the second load electrode 320.

The outer termination region 698 may include counter-doped regions that are spaced from the second surface 102 and that form pn junctions with the drift structure 131, wherein the conductivity type of counter-doped regions is the conductivity type of the body regions 120. According to another embodiment, the outer termination region 698 is free of counter-doped regions that are spaced from the second surface 102 and that form pn junctions with the drift structure 131. According to a further embodiment, the outer termination region 698 is completely free of counter-doped regions.

The outer termination region 698 may include trench structures that extend from the first surface 101 into the semiconductor portion 100, wherein the trench structures may include conductive structures electrically separated from the second field electrodes 175. According to another embodiment, the outer termination region 698 is free of trench structures that extend from the first surface 101 into the semiconductor portion 100.

A transition region 650 that includes one or more body regions 120 separating the drift structure 131 from the first surface 101 may separate the transistor cell region 610 and the termination region 690. The transition region 650 may be devoid of contact structures electrically connecting doped regions in the semiconductor portion 100 with the first load electrode 310 and may include further first or further second field plate structures 160, 170. The transition region 650 is also devoid of controllable transistor cells TC and may be completely devoid of doped zones equivalent to the source regions 110 with respect to position and dopant concentration.

In the transition region 650 the gate structure 150 may include connection portions 157 forming end portions of the gate structure 150, wherein a width of the connection portions 157 may be greater than a width of the gate edge portions 153.

Intersections of the first pn junctions pn1 between the body regions 120 of the transition region 650 and an edge section 131*c* of the drift structure 131 and the first surface 101 form portions of the boundary between the transition region 650 and the termination region 690.

Each intersection between first surface 101 and first pn junction pn1 runs from one second field plate structure 170 to a neighboring second field plate structure 170, wherein both second field plate structures 170 have the same distance to the transistor cell region 610. In other words, an outer edge of the body region 120 at any side of the transistor cell region 610 in the finalized semiconductor device 500 cuts a row of second field plate structures 170. The position of the intersections between first surface 101 and first pn junctions pn1 results from the position of an edge of an implant mask used for implanting the dopants defining the body region 120 and the thermal budget applied after the implant.

According to an embodiment, direct virtual connection lines between neighboring intersections between first surface 101 and first pn junction pn1 cross central portions of the second field plate structures 170, wherein a minimum distance between the center points of the second field plate structures 170 and the virtual connection lines is at most 40%, e.g., at most 25% of a largest width of the second field plate structures 170 in the plane of the first surface 101.

In the inner termination region 692 and the transition region 650 no further structures are formed that need an additional process. The termination construction of the semiconductor device 500 gets along without additional processes and thus combines high blocking capability of the termination region 690 with low fluctuations of the avalanche breakdown voltage, high avalanche ruggedness and low process costs.

Alternatively, a continuous, stripe-shaped end trench may form a frame that completely surrounds the transistor cell region. For achieving high blocking capability and avalanche ruggedness, the vertical extension of the frame trench has to be tuned to the vertical extension of the field plate structures in the transistor cell region 610 and an additional process has to be added to decouple the trench depth of the frame trench from the trench depth of the needle-shaped field plate trench. According to another alternative an additional process forms thicker field dielectrics in the termination region than in a transistor cell region. By contrast, the termination construction of the semiconductor device 500 ensures high blocking capability and avalanche ruggedness without additional processes.

Finally, compared to a termination region with counter-doped regions that may be electrically connected to the second field electrodes, the device characteristics of the termination region 690 of semiconductor device 500 are less susceptible to process variations.

Figure 2A:
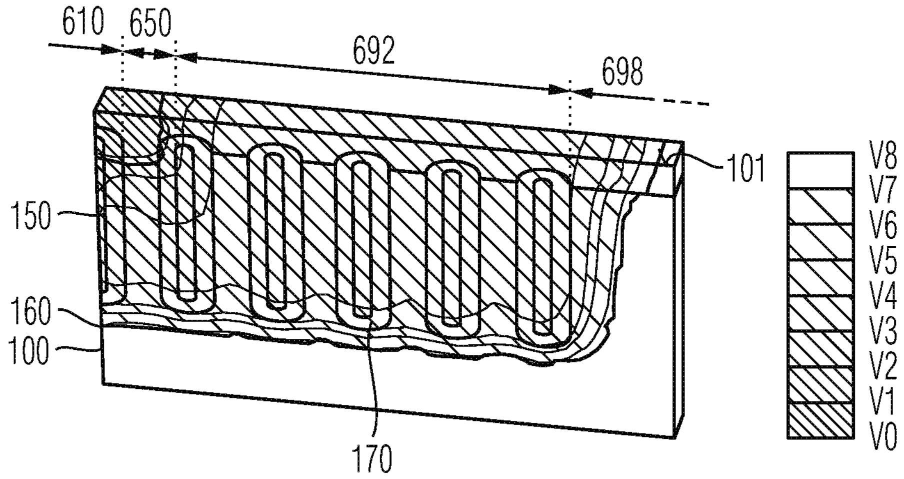
FIG. 2A is a schematic perspective view showing the electrostatic potential distribution in a portion of a semiconductor device with five rows of needle-shaped second field plate structures in a termination region for illustrating effects of the embodiments.

FIG. 2A shows the electrostatic potential distribution in a termination region 690 including four rows of second field plate structures 170 between the transition region 650 and the outer termination portion 698. An outer edge of the body region 120 overlaps with the innermost second field plate structures 170 of the inner termination region 692.

Figure 2B:
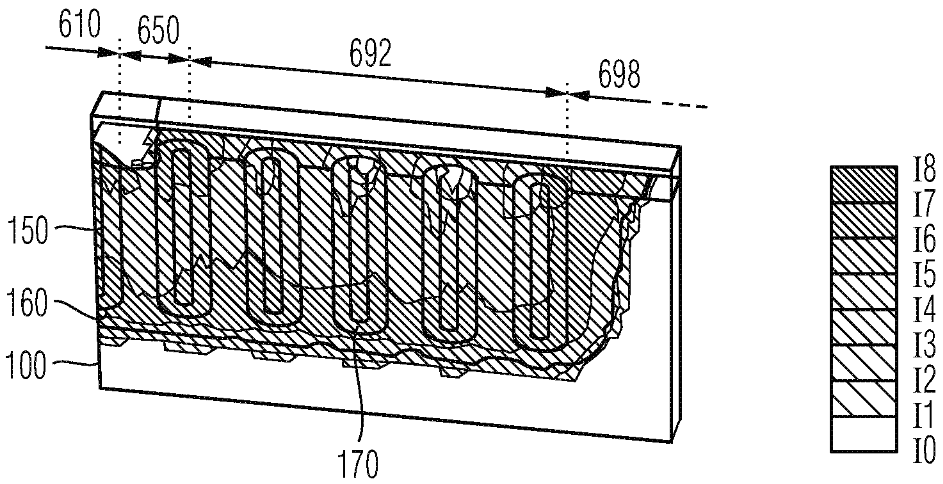
FIG. 2B is a schematic perspective view showing the distribution of impact ionization in a portion of a semiconductor device with five rows of needle-shaped second field plate structures in a termination region for illustrating effects of the embodiments.

FIG. 2B shows impact ionization density in the avalanche case, wherein a high impact ionization density points to the location of the avalanche breakdown. When the outer edge of the body region 120 runs between second field plate structures 170 having the same distance to the transistor cell region 610, most of the impact ionization takes place along the outer edge of the outermost second field plate structures 170 and close to the first surface 101.

Figure 3A:
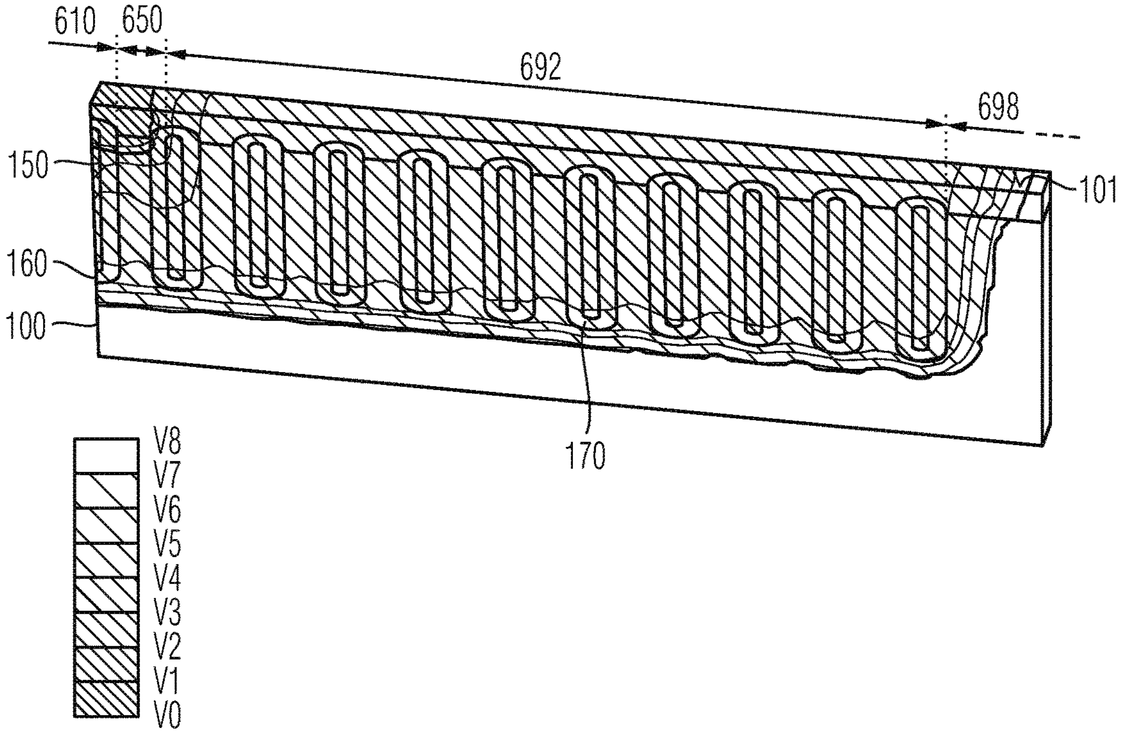
FIG. 3A is a schematic perspective view showing the electrostatic potential distribution in a portion of a semiconductor device with ten rows of needle-shaped second field plate structures in a termination region for illustrating effects of the embodiments.
Figure 3B:
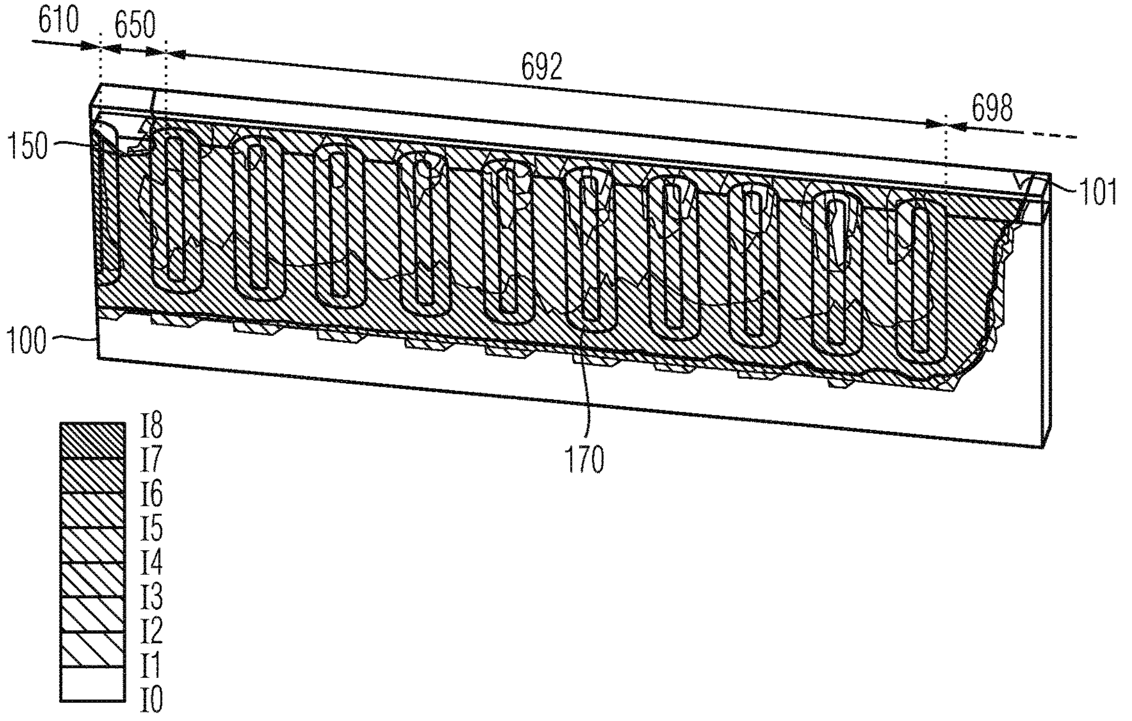
FIG. 3B is a schematic perspective view showing the distribution of impact ionization in a portion of a semiconductor device with ten rows of needle-shaped second field plate structures in a termination region for illustrating effects of the embodiments.

FIGS. 3A to 3B show the electrostatic potential distribution and the impact ionization density in case of avalanche breakdown for termination region 690 with ten rows of second field plate structures 170 forming the inner termination region 692, wherein again the outer edge of the body region 120 runs between second field plate structures 170 having the same distance to the transistor cell region 610.

While the electric field distribution is similar to that of FIG. 2A, the breakdown is localized close to the bottom of the last active transistor cell in the transistor cell region 610.

In such case avalanche current mainly distributes equally and uniformly across the complete transistor cell region 610, avalanche behavior is comparatively stable and the semiconductor device 500 shows high avalanche ruggedness.

Figure 4A:
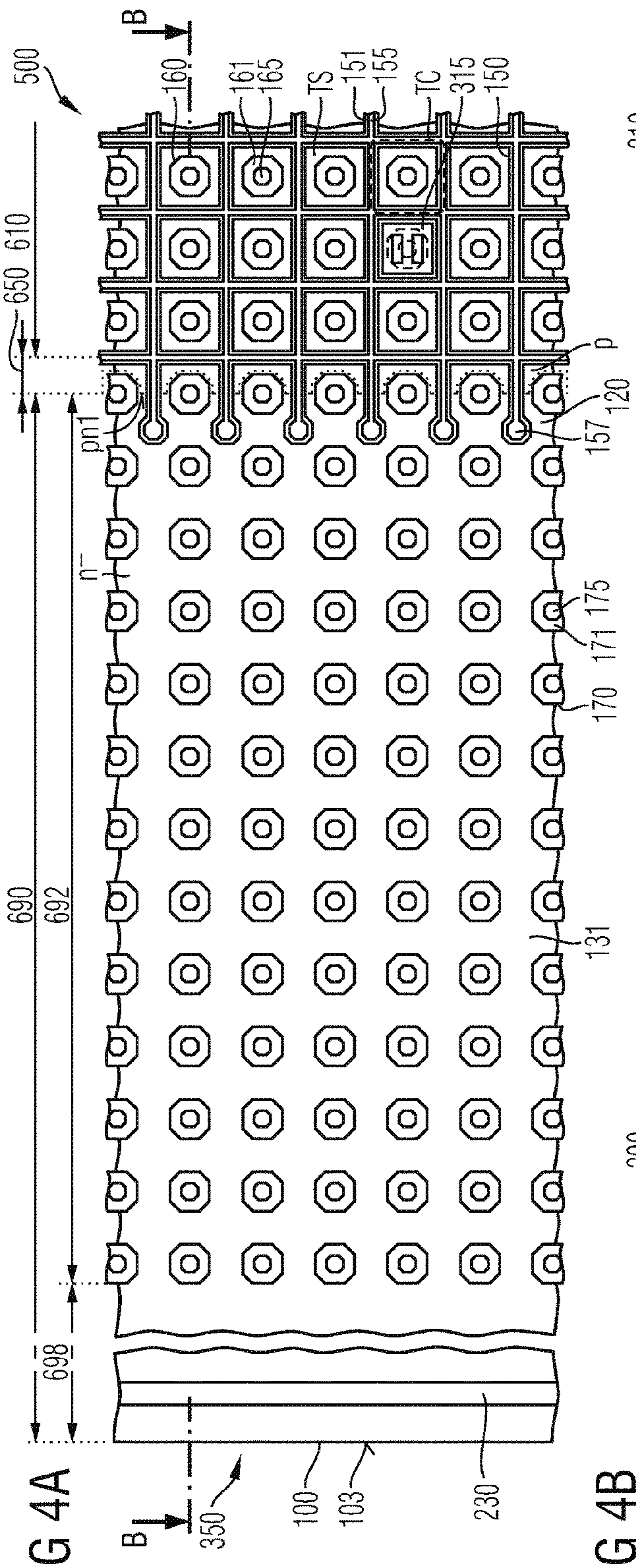
FIG. 4A is a schematic horizontal cross-sectional view of a portion of a semiconductor device according to an embodiment with narrow transition region and field stop layer.
Figure 4B:
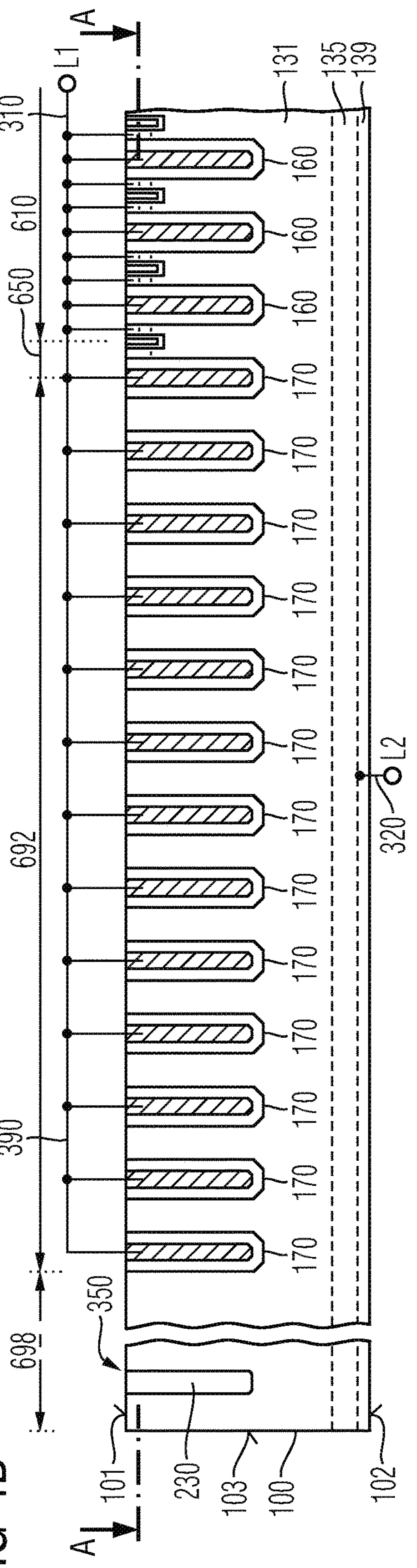
FIG. 4B is a schematic vertical cross-sectional view of the semiconductor device portion of FIG. 4A along line B-B.
Figure 4C:
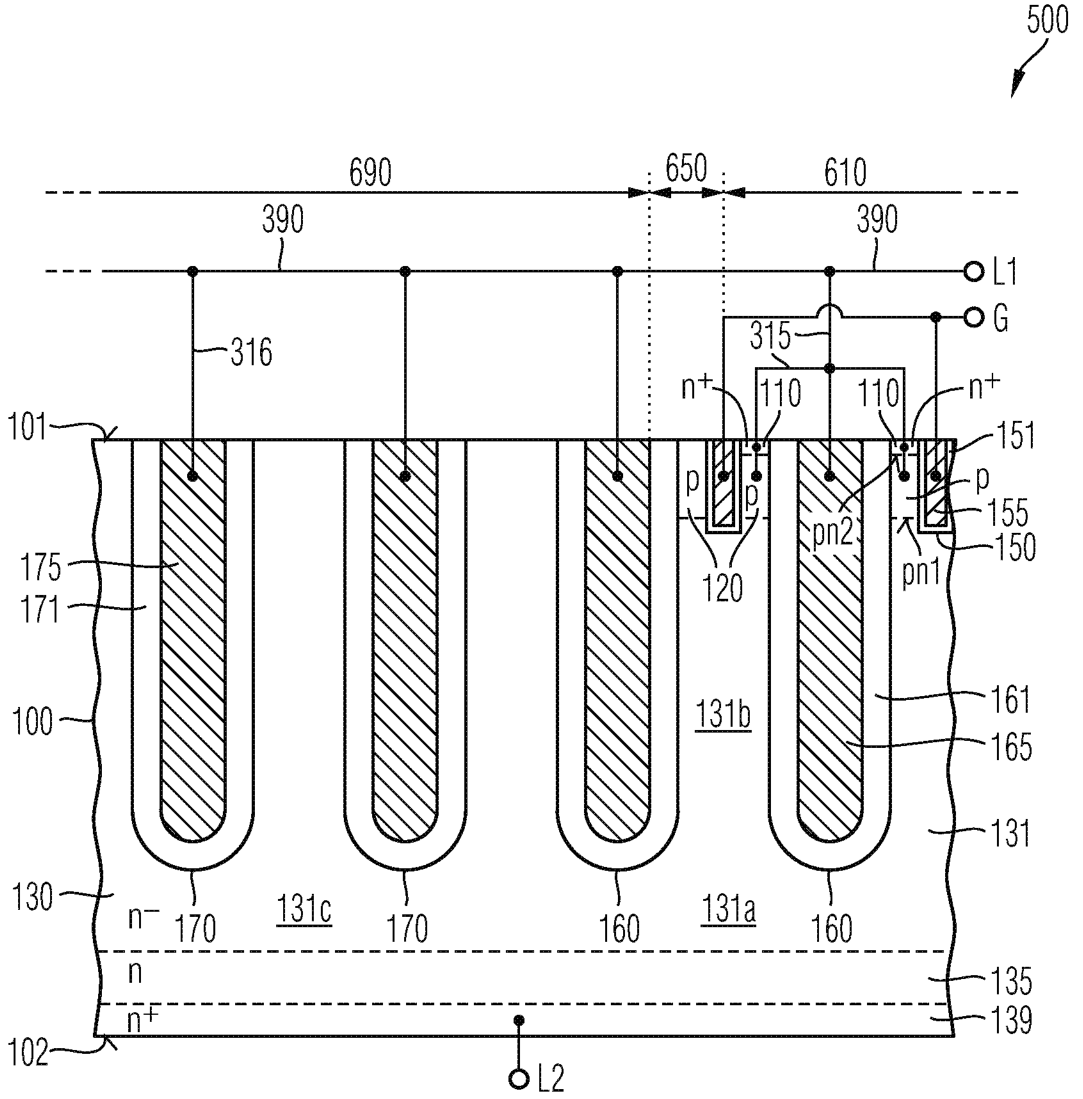
FIG. 4C is an enlarged view of a detail of FIG. 4B.

In the semiconductor device 500 of FIGS. 4A to 4C the drain structure 130 includes a field stop layer 135 sandwiched between the drift structure 131 and the contact portion 139. A mean dopant concentration in the field stop layer 135 may be at least five times as high as a mean dopant concentration in the drift structure 131 and at most one-fifth of a maximum dopant concentration in the contact portion 139. The auxiliary electrode 390 is directly connected with the first load electrode 310 such that both the first and the second field electrodes 165, 175 are electrically connected to the first load electrode 310 and the first load terminal L1.

The transition region 650 may be formed between outermost portions of the gate structure 150 and the innermost second field plate structure 170 of the termination region 690 such that in this embodiment the transition region 650 does not include first or second field plate structures 160, 170. The first pn junction pn1 between the body region 120 and the edge section 131*c* of the drift structure 131 along the first surface 101 runs between portions of the gate structure 150 and the innermost second field plate structures 170.

The edge construction 350 in the outer termination region 698 may include a trench structure 230 that may extend from the first surface 101 into the semiconductor portion 100. The trench structure 230 may effective as chipping stopper suppressing the propagation of cracks from the outer lateral surface 103 into the transistor cell region 610 and/or suppressing the diffusion of ions from the outer lateral surface 103 into the transistor cell region 610.

A vertical extension of the trench structure 230 may be smaller than, equal to, or greater than a vertical extension of the first field plate structures 160. The trench structure 230 may include several separated stripe-shaped single trenches that are arranged to form one, two or more frame-like structures at a distance to the outer lateral surface 103 and around the inner termination region 692.

The trench structure 230 may be completely filled with an insulator material, e.g., a silicon oxide or a spin-on-glass. According to an embodiment, an insulator layer may line sidewalls of the trench structure 230 and may insulate a conductive fill of the trench structure 230 from the semiconductor portion 100. The conductive fill of the trench structure 230 may float or may be electrically connected to a structure with an electric potential equal to or at least close to an electric potential of the drift structure 131, for example the drain potential in case the semiconductor device 500 is an IGFET. According to a further embodiment, the trench structure 230 includes an insulator layer along sidewalls of the trench structure 230 and a void in the center of the trench structure.

Figure 5:
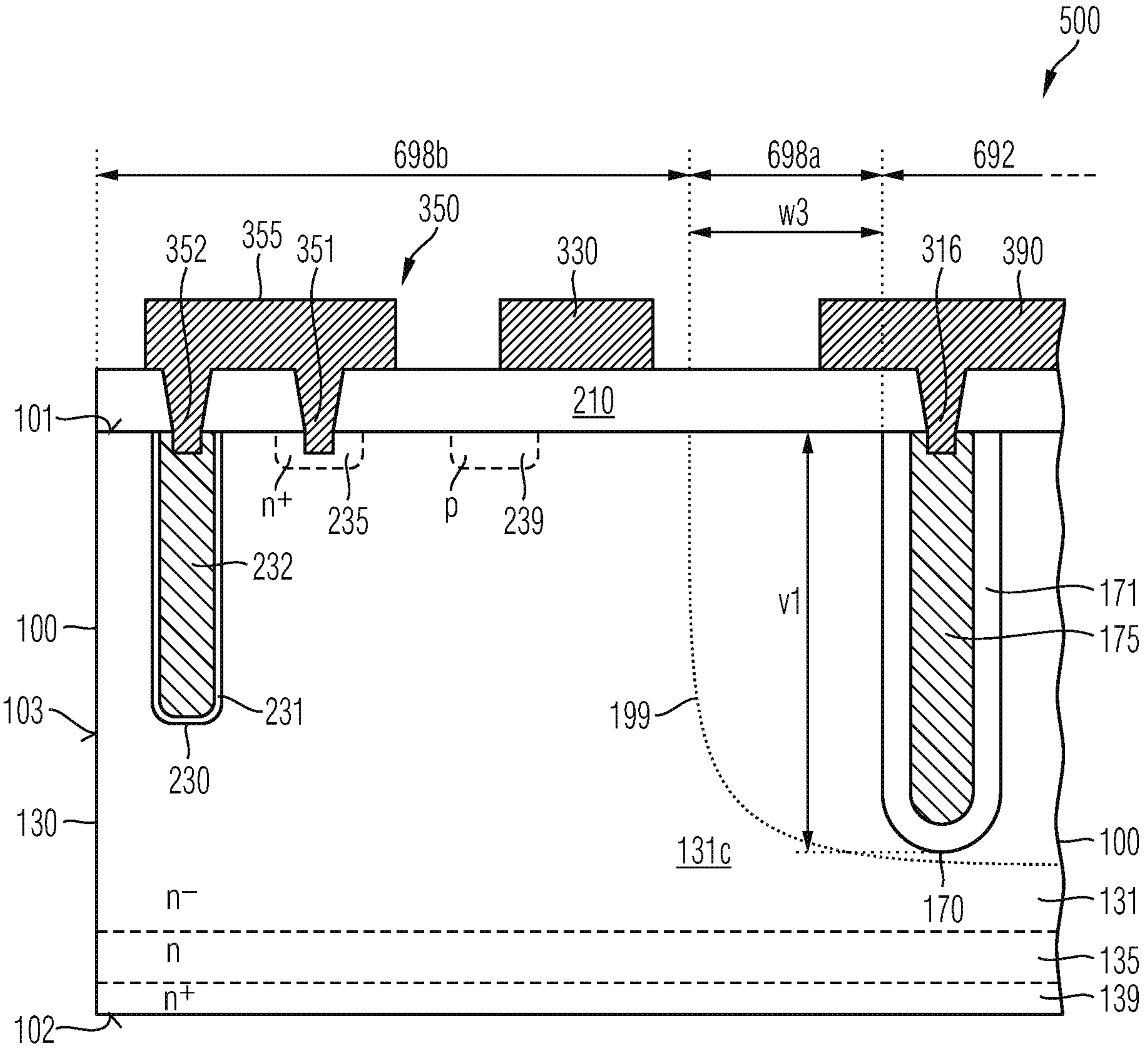
FIG. 5 is a schematic vertical cross-sectional view of an outer termination region according to an embodiment referring to a drain field plate.

In FIG. 5 the edge construction 350 includes a trench structure 230 with a conductive fill 232 and an insulator layer 231 separating the conductive fill 232 from the semiconductor portion 100.

First and second termination contacts 351, 352 extend through the interlayer dielectric 210 and electrically connect a termination electrode 355 with the conductive fill 232 and with a heavily doped region 235 formed in the semiconductor portion 100 along the first surface 101 in the outer termination region 698 such that the conductive fill 232 is electrically connected to the potential of the drift structure 131. The heavily doped region 235 may also be effective as channel stopper preventing the formation of parasitic channels along the first surface 101.

The outer termination region 698 may be completely free of counter-doped regions between the lateral outer surface 103 and the outermost second field plate structures 170 of the inner termination region 692 as well as between the field stop layer 135 and the first surface 101.

According to the illustrated embodiment, the outer termination region 698 includes a counter-doped region 239 in an outer section 698*b* directly adjoining the lateral outer surface 103 and separated from the inner termination region 692 by an inner section 698*a* of the outer termination region 698, wherein the inner section 698*a* is devoid of counter-doped regions. A width w3 of the inner section 698*a* may be at least 50% of a vertical extension v1 of the outermost second field plate structures 170, e.g., at least 100% of the vertical extension v1 such that no counter-doped region exists in the area of a depletion zone 199 extending from the first pn junction into the drift structure 131.

In the outer termination region 698 a gate conductor 330 electrically connected to the gate electrodes of the transistor cells in the transistor cell region may be between the auxiliary electrode 390 and the lateral outer surface 103, or, if applicable, between the auxiliary electrode 390 and a termination electrode 355.

In the inner termination region 692, the interlayer dielectric 210 may separate an auxiliary electrode 390, which may be connected with a first load electrode, from the semiconductor portion 100 and second contact structures 316 extending through openings in the interlayer dielectric 210 connect the auxiliary electrode 390 with the second field electrodes 175.

Figure 6:
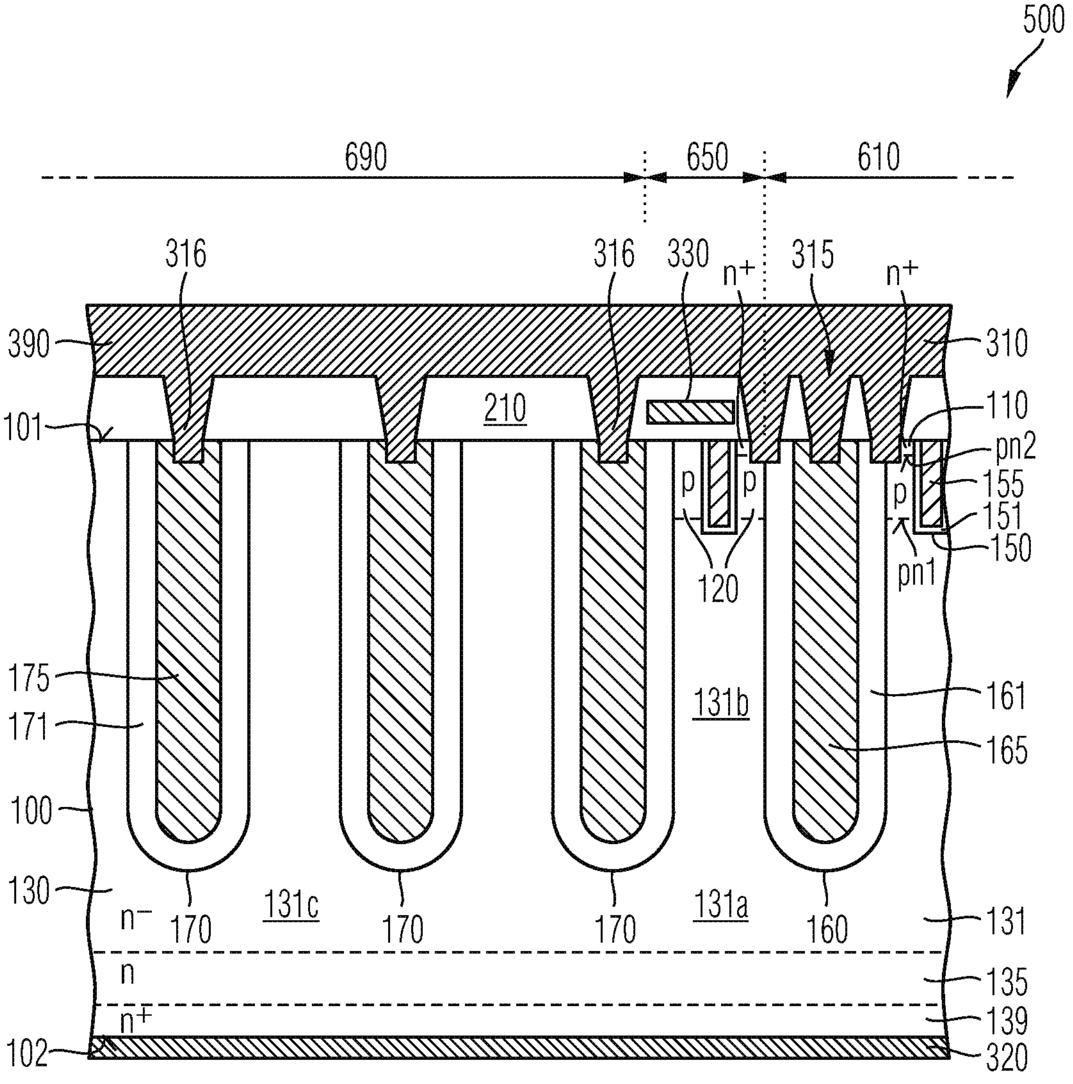
FIG. 6 is a schematic vertical cross-sectional view of a portion of a semiconductor device according to an embodiment with a gate connector formed between portions of an interlayer dielectric.

In FIG. 6 the interlayer dielectric 210 separates the first load electrode 310 from the semiconductor portion 100. First contact structures 315 may electrically connect the first load electrode 310 with the source regions 110 and the body region 120 as well as with the first field electrodes 165 of the transistor cells TC in the transistor cell region 610. In a plane parallel to the first surface 101, a cross-section of the first contact structures 315 may include stripe-shaped sub portions, for example a frame of equal width and a further stripe portion extending through the frame as indicated for one transistor cell TC of FIG. 4A.

Second contact structures 316 may extend through the interlayer dielectric 210 and may directly electrically connect the auxiliary electrode 390 with the second field electrodes 175 in the termination region 690 and, if applicable, in the transition region 650.

The interlayer dielectric 210 may embed a gate conductor 330, wherein in a plane parallel to the cross-sectional plane gate contacts may extend from the gate conductor 330 to connection portions of the gate structure 150. The gate conductor 330 may include a metal layer and/or a heavily doped polycrystalline silicon layer.

According to another embodiment, the gate conductor 330 may be a metal structure formed in the plane of the first load electrode 310 and laterally separated from the first load electrode 310 and the auxiliary electrode 390 on top of the interlayer dielectric 210, wherein the gate contacts extend through the complete interlayer dielectric 210.

The interlayer dielectric 210 adjoins the first surface 101 and electrically insulates the gate electrode 155 from the first load electrode 310 arranged at the front side. In addition, the interlayer dielectric 210 may insulate mesa sections of the semiconductor portion 100 in the termination region 690 from the auxiliary electrode 390.

The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

The first load electrode 310 may form or may be electrically coupled or connected to the first load terminal, for example the source terminal in case the semiconductor device 500 is an IGFET. A second load electrode 320, which directly adjoins the second surface 102 and the contact portion 139, may form or may be electrically connected to a second load terminal, which may be the drain terminal in case the semiconductor device 500 is an IGFET.

Each of the first load electrode 310, second load electrode 320, auxiliary electrode 390, and gate conductor 330 may consist of or contain, as main constituent(s), aluminum (Al), copper (Cu), or alloys of aluminum or copper, for example AlSi, AlCu or AlSiCu. According to other embodiments, at least one of the first load electrode 310, second load electrode 320, auxiliary electrode 390, and gate conductor 330 may contain, as main constituent(s), nickel (Ni), tin (Sn), titanium (Ti), tungsten (W), tantalum (Ta), vanadium (V), silver (Ag), gold (Au), platinum (Pt), and/or palladium (Pd). For example, at least one of the first load electrode 310, second load electrode 320, auxiliary electrode 390, and gate conductor 330 may include two or more sub-layers, wherein each sub-layer contains one or more of Ni, Sn, Ti, V, Ag, Au, Pt, W, and Pd as main constituent(s), e.g., a silicide, a nitride and/or an alloy.

The first contact structures 315 as well as the second contact structures 316 may include one or more conductive metal containing layers based on, e.g., titanium (Ti) or tantalum (Ta) and a metal fill portion, e.g., based on tungsten (W). According to other embodiments the first and second contact structures 315, 316 include heavily doped semiconductor structures, e.g., heavily n-doped polycrystalline structures or heavily p-doped columnar single crystalline structures.

Figure 7:
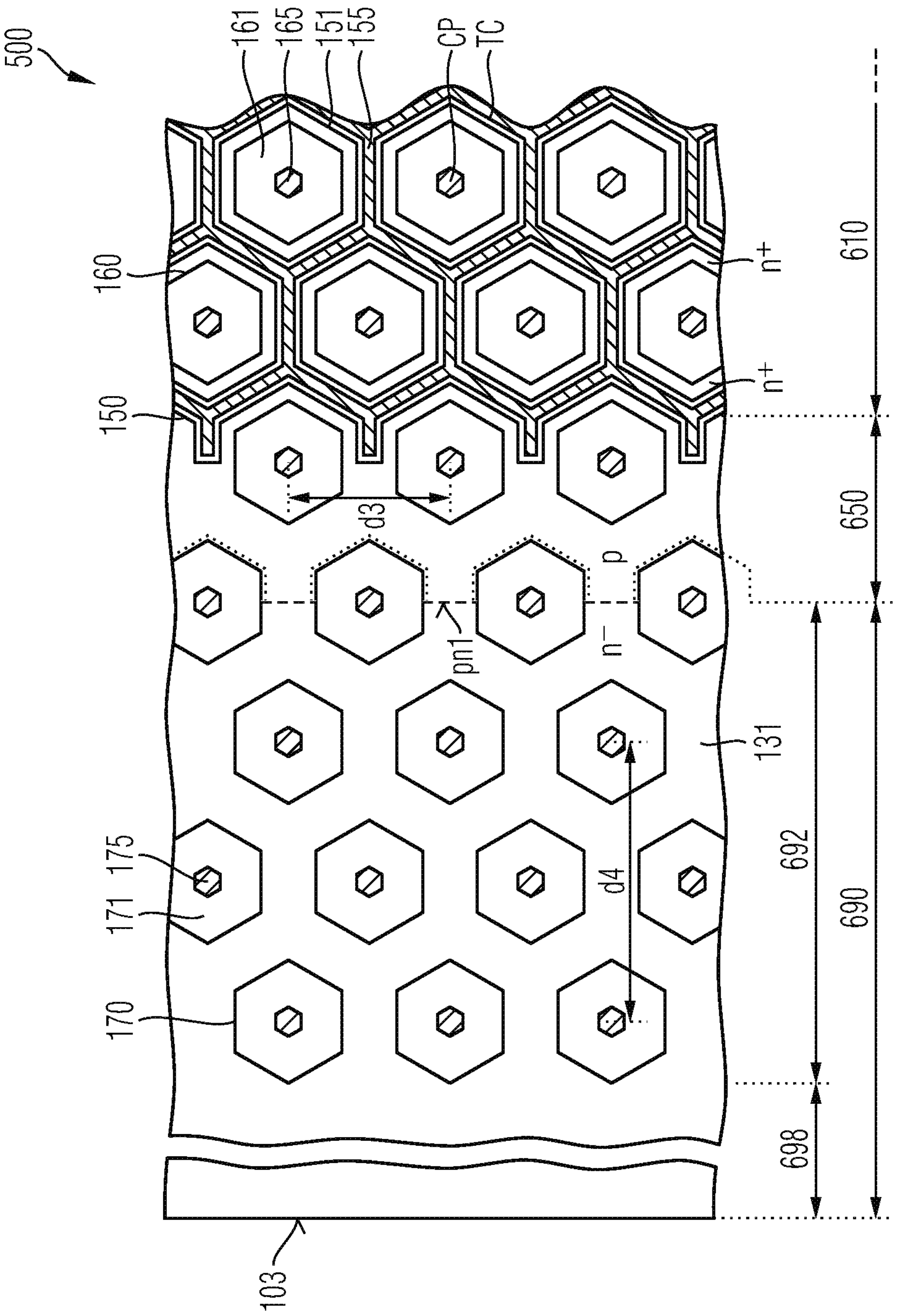
FIG. 7 is a schematic horizontal cross-sectional view of a portion of a semiconductor device according to an embodiment concerning transistor cells with hexagonal cross-sectional area.

FIG. 7 refers to an embodiment with hexagonal transistor cells TC. The first and second field plate structures 160, 170 are arranged in shifted lines with the center points of first and second field plate structures 160, 170 in neighboring lines shifted against each other by the half center-to-center distance d3, d4 within the lines.

Figure 8A:
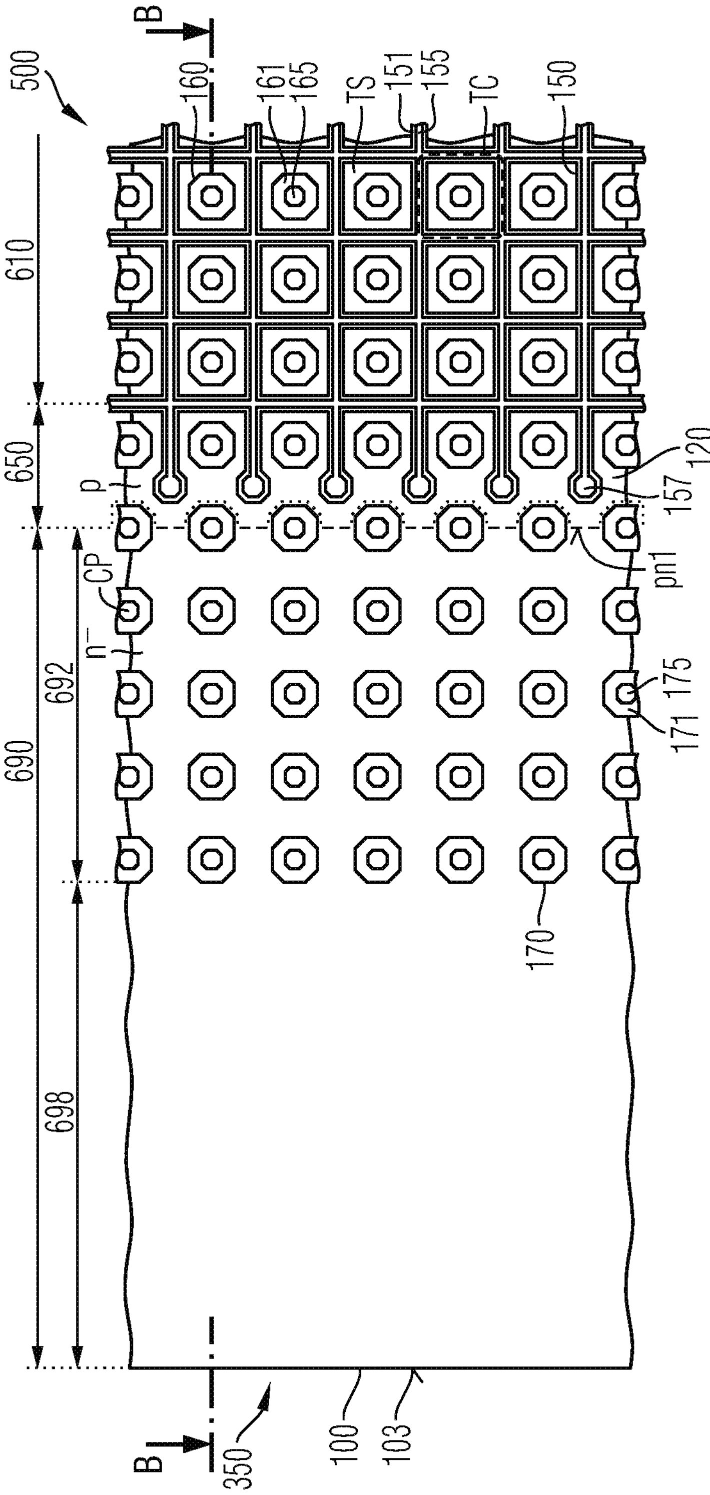
FIG. 8A is a schematic horizontal cross-sectional view of a portion of a semiconductor device according to an embodiment including five rows of needle-shaped second field plate structures in a termination region.
Figure 8B:
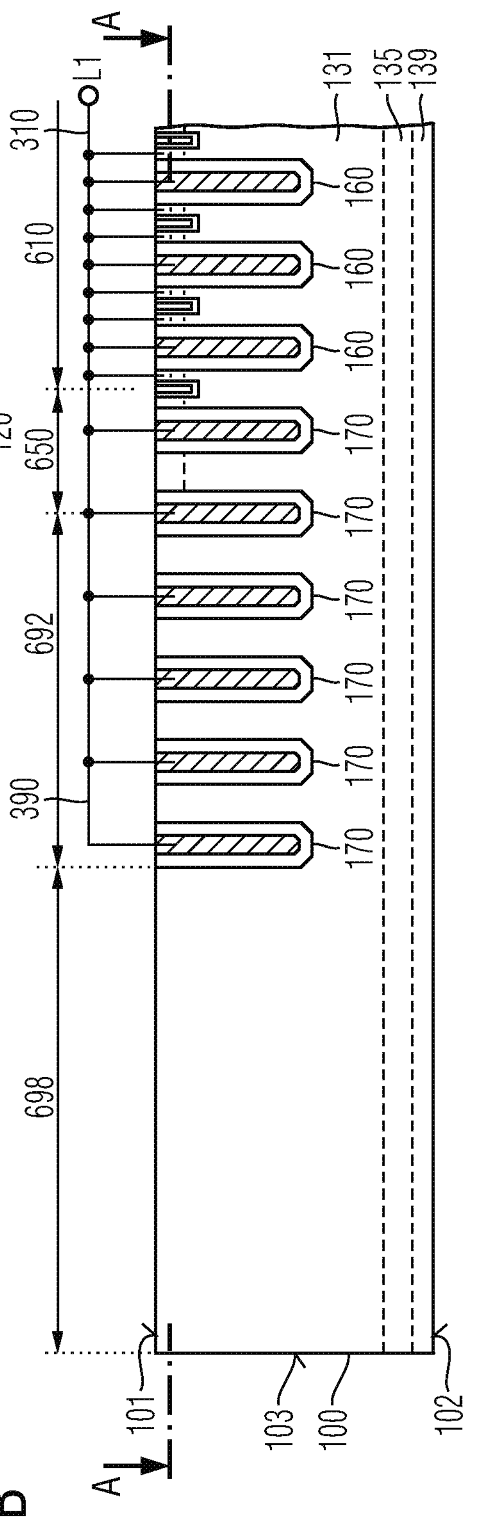
FIG. 8B is a schematic vertical cross-sectional view of the semiconductor device portion of FIG. 8A along line B-B.

In FIGS. 8A to 8B the inner termination region 692 includes six rows of second field plate structures 170. The distance between neighboring rows of second field plate structures 170 may be constant or may vary.

Figure 9A:
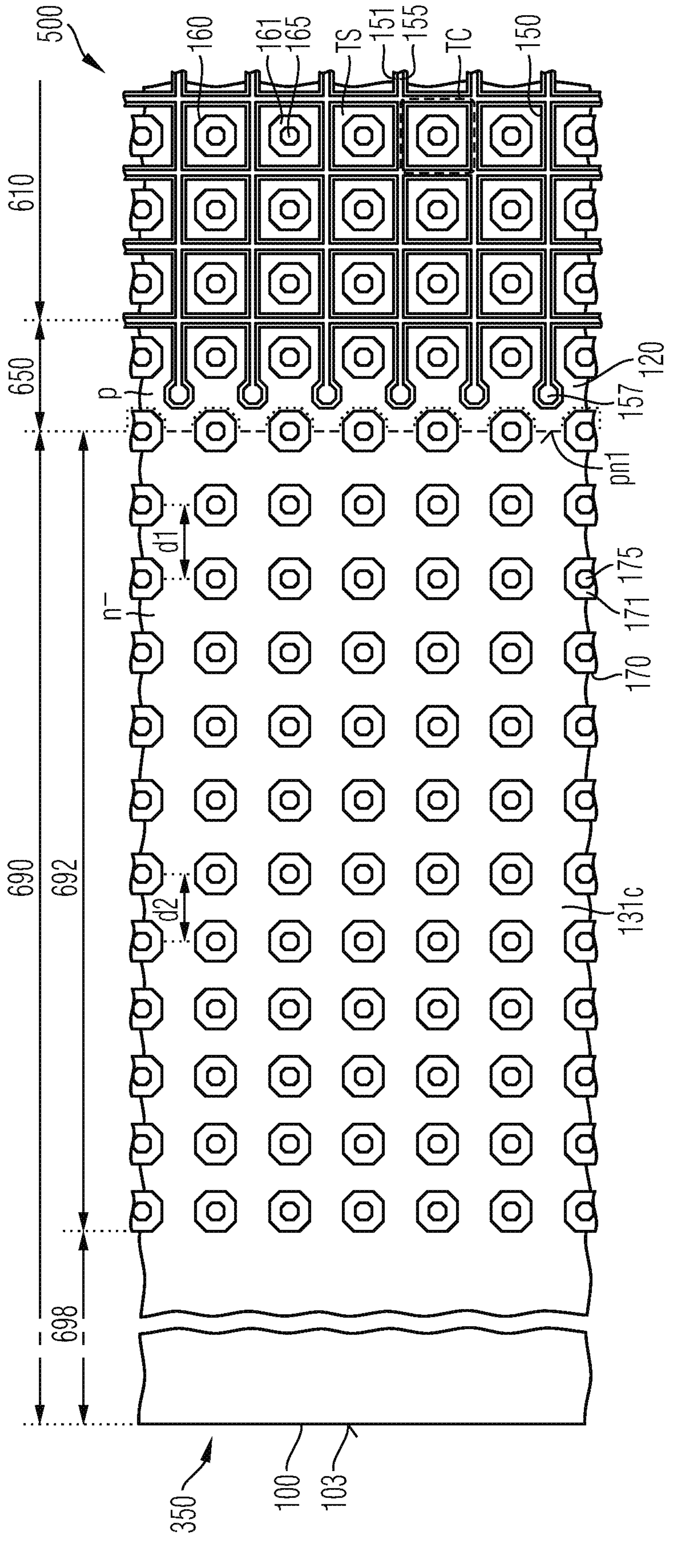
FIG. 9A is a schematic horizontal cross-sectional view of a portion of a semiconductor device including needle-shaped field plate structures according to an embodiment with narrow-spaced field plate structures in the termination region.

In FIG. 9A the transition region 650 includes one row of second field plate structures 170 and the termination region 690 includes 12 rows of second field plate structures 170 per side of the transistor cell region 610. Some of the outermost rows of second field plate structures 170 have a center-to-center distance d2 which is smaller than the distance d1 between center points of neighboring rows of second field plate structures 170 close to the transistor cell region 610 by, e.g., at least 10% of the distance d1. In addition, a vertical dopant concentration in the drift structure 131 may decrease or increase with increasing distance to the first surface 101 at least in the edge section 131*c* of the drift structure 131.

Figure 9B:
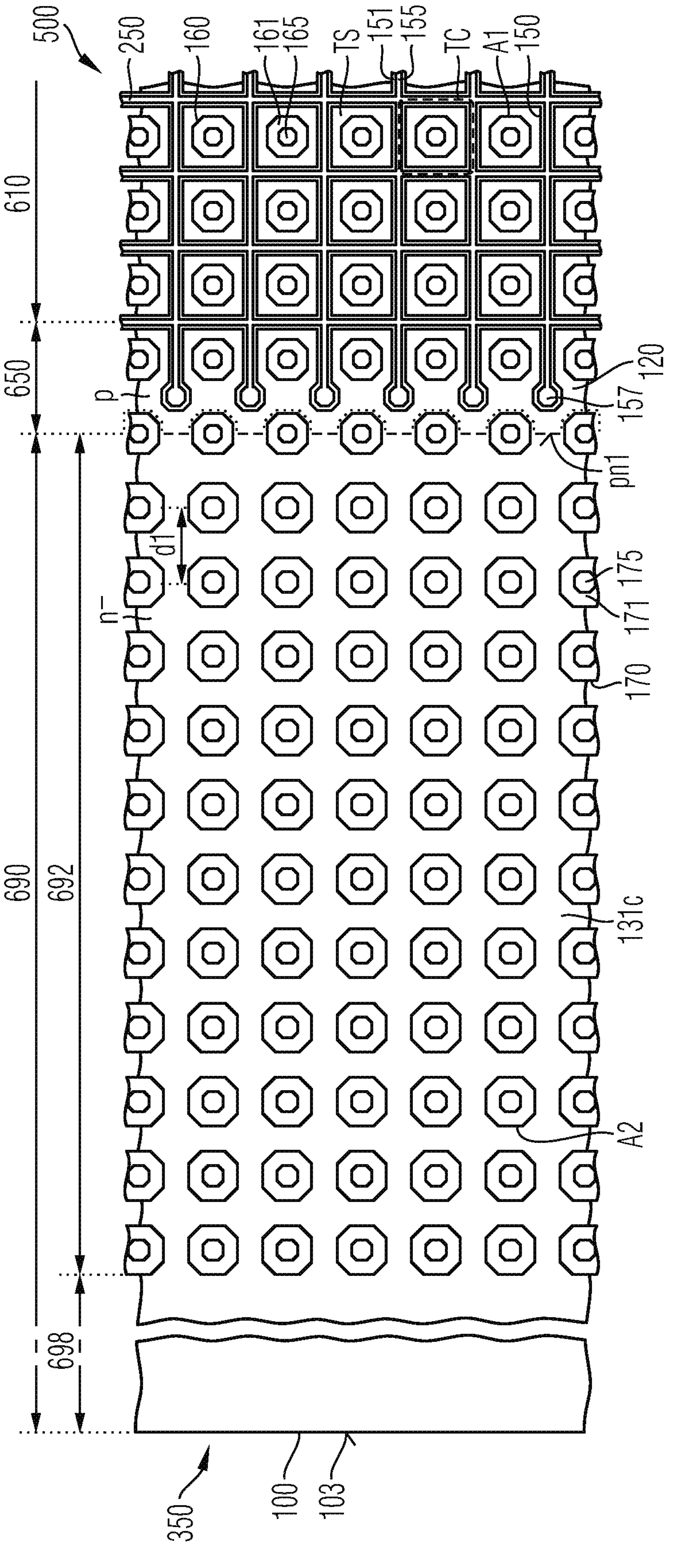
FIG. 9B is a schematic horizontal cross-sectional view of a portion of a semiconductor device including needle-shaped field plate structures according to an embodiment with wide field plate structures in the termination region.

In FIG. 9B the first and second field plate structures 160, 170 have the same distance d1 between center points. A mean horizontal cross-sectional area A2 of at least some of the second field plate structures 170 in a plane coplanar with the first surface 101 may be greater than a mean horizontal cross-sectional area A1 of the first field plate structures 160 by, e.g., at least 10% of A1. In addition, a mean dopant concentration in the drift structure 131 may decrease or increase with increasing distance to the first surface 101 at least in the edge section 131*c*.

Figure 10:
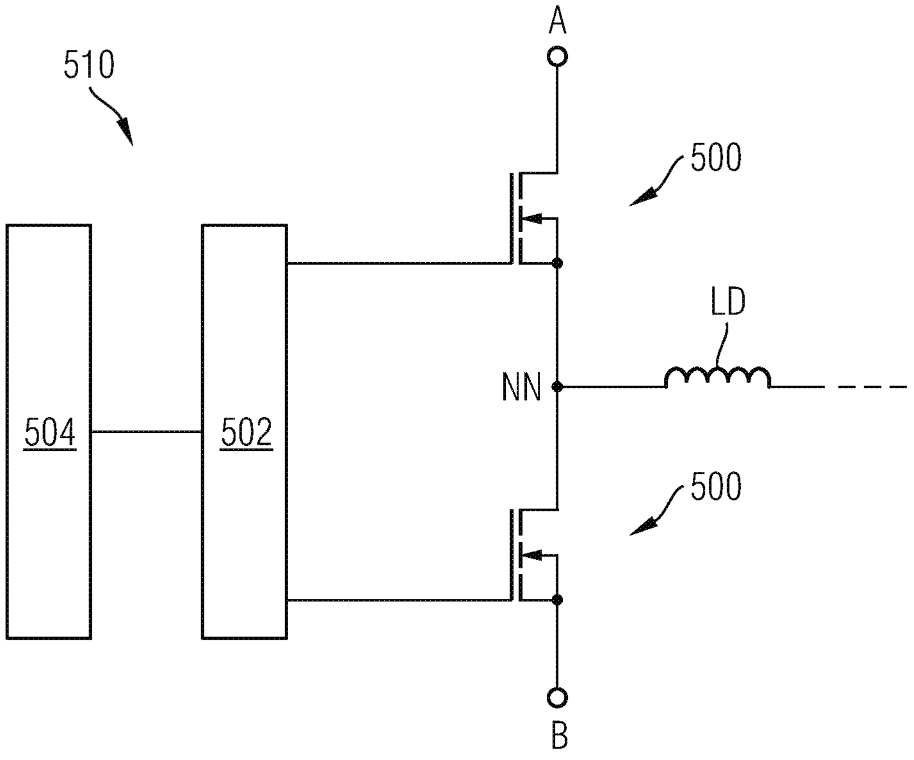
FIG. 10 is a schematic circuit diagram of an electronic assembly according to an embodiment related to switched-mode power supplies and motor drives.

FIG. 10 refers to an electronic assembly 510 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 510 may include two identical semiconductor devices 500 as described above. The semiconductor devices 500 may be IGFETs and the load paths of the two semiconductor devices 500 are electrically arranged in series between a first supply terminal A and a second supply terminal B. The supply terminals A, B may supply a DC (direct-current) voltage or an AC (alternating-current) voltage. The network node NN between the two semiconductor devices 500 may be electrically connected to an inductive load, which may be a winding of a transformer or a motor winding, or to a reference potential of an electronic circuit, by way of example. The electronic assembly may further include a control circuit 504 configured to supply a control signal for alternately switching on and off the semiconductor devices 500 and a gate driver 502 controlled by the control circuit 504 and electrically connected to gate terminals of the semiconductor devices 500.

The electronic assembly 510 may be a motor drive with the semiconductor devices 500 electrically arranged in a half-bridge configuration, wherein the network node NN is electrically connected to a motor winding and the supply terminals A, B supplying a DC voltage.

According to another embodiment, the electronic assembly 510 may be a primary side stage of a switched mode power supply with the supply terminals A, B supplying an AC voltage of an input frequency to the electronic circuit 510. The network node NN is electrically connected to a primary winding of a transformer.

The electronic assembly 510 may be a synchronous rectifier of a switched mode power supply with the supply terminals A, B connected to a secondary winding of the transformer and the network node NN electrically connected to a reference potential of the electronic circuit at the secondary side of the switched mode power supply.

According to a further embodiment, the electronic assembly 510 may be a primary side stage of a DC-to-DC converter, e.g., a power optimizer or a micro-inverter for applications including photovoltaic cells with the supply terminals A, B supplying a DC voltage to the electronic assembly 510 and the network node NN electrically connected to an inductive storage element.

According to another embodiment, the electronic assembly 510 may be a secondary side stage of a DC-to-DC converter, e.g., a power optimizer or a micro-inverter for applications including photovoltaic cells, wherein the electronic circuit 510 supplies an output voltage to the supply terminals A, B and wherein the network node NN is electrically connected to the inductive storage element.

According to another embodiment a semiconductor device may include a transistor cell region with needle-shaped first field plate structures that extend from a first surface into a semiconductor portion that includes a drift structure of a first conductivity type. An inner termination region surrounds the transistor cell region and includes needle-shaped second field plate structures. An outer termination region devoid of second field plate structures is sandwiched between a lateral outer surface of the semiconductor portion and outermost second field plate structures. In a transition region sandwiched between the transistor cell region and the inner termination region a body region, which forms a first pn junction with the drift structure, directly adjoins to the first surface. Intersections between the first pn junction and the first surface run from one second field plate structure to a neighboring second field plate structure, wherein the two second field plate structures have a same distance to the transistor cell region.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
- a transistor cell region comprising a gate structure, a plurality of needle-shaped first field plate structures, body regions of a second conductivity type, and source regions of a first conductivity type;
- a first termination region devoid of transistor cells, the first termination region surrounding the transistor cell region and comprising needle-shaped second field plate structures; and
- a second termination region surrounding the first termination region and comprising one or more stripe-shaped trenches.

2. The semiconductor device of claim 1, wherein the gate structure forms a grid having uninterrupted meshes.

3. The semiconductor device of claim 1, wherein center points of the needle-shaped second field plate structures and center points of the needle-shaped first field plate structures are equally spaced such that the needle-shaped second field plate structures and the needle-shaped first field plate structures complement each other in a regular pattern.

4. The semiconductor device of claim 1, wherein one or more outermost rows of the needle-shaped second field plate structures have a center-to-center distance which is smaller than a distance between center points of rows of the needle-shaped second field plate structures which are positioned closer to the transistor cell region than the one or more outermost rows of the needle-shaped second field plate structures.

5. The semiconductor device of claim 1, wherein an arrangement of center points of the needle-shaped second field plate structures is congruent to an arrangement of center points of a portion of the needle-shaped first field plate structures.

6. The semiconductor device of claim 1, further comprising:
- a transition region interposed between the transistor cell region and the first termination region,
- wherein the transition region forms a first pn junction with a drift structure of the transistor cell region.

7. The semiconductor device of claim 6, wherein the first pn junction extends horizontally between neighboring ones of the needle-shaped second field plate structures aligned in a same row, and wherein the needle-shaped second field plate structures in the same row have the same distance to the transistor cell region.

8. The semiconductor device of claim 6, wherein the transition region comprises connection portions of the gate structure.

9. The semiconductor device of claim 1, further comprising:
- an auxiliary electrode; and
- second contact structures electrically connecting, in the first termination region, the auxiliary electrode with second field electrodes in the needle-shaped second field plate structures.

10. The semiconductor device of claim 9, wherein the auxiliary electrode is electrically connected with a first load electrode, and wherein the first load electrode is electrically connected with first field electrodes in the needle-shaped first field plate structures.

11. The semiconductor device of claim 1, wherein the one or more stripe-shaped trenches are filled with an insulator material.

12. The semiconductor device of claim 11, wherein the insulator material is silicon oxide or a spin-on-glass.

13. The semiconductor device of claim 1, wherein the one or more stripe-shaped trenches comprises:
- an insulating layer along sidewalls of the one or more stripe-shaped trenches; and
- a conductive fill.

14. The semiconductor device of claim 1, wherein the one or more stripe-shaped trenches comprises:
- at least one insulator layer along sidewalls of the one or more stripe-shaped trenches; and
- a void in a center of the one or more stripe-shaped termination trenches.

15. The semiconductor device of claim 1, wherein the first termination region is devoid of a body region and a drift structure extends to a first surface of the first termination region.

16. The semiconductor device of claim 1, wherein the one or more stripe-shape trenches have a vertical extension that is smaller than a vertical extension of the plurality of needle-shaped first field plate structures.

17. The semiconductor device of claim 1, wherein the one or more stripe-shape trenches have a vertical extension equal to a vertical extension of the plurality of needle-shaped first field plate structures.

18. The semiconductor device of claim 1, wherein the one or more stripe-shape trenches have a vertical extension greater than a vertical extension of the plurality of needle-shaped first field plate structures.

19. The semiconductor device of claim 1, wherein the one or more stripe-shape trenches form a frame-like structure around the first termination region.

20. A semiconductor device, comprising:
- a transistor cell region comprising a gate structure and at least one needle-shaped first field plate structure;
- a first termination region surrounding the transistor cell region and comprising at least one needle-shaped second field plate structure, the first termination region being devoid of a body region and comprising a drift structure that extends to a first surface of the first termination region; and
- a second termination region surrounding the first termination region and comprising one or more stripe-shaped trenches.

21. The semiconductor device of claim 20, wherein the one or more stripe-shaped trenches comprise:
- at least one insulator layer along sidewalls of the one or more stripe-shaped trenches; and
- a void in a center of the one or more stripe-shaped termination trenches.

* * * * *